United States Patent
Tseng

(10) Patent No.: US 11,032,055 B1
(45) Date of Patent: Jun. 8, 2021

(54) CLOCK DATA RECOVERY CIRCUIT

(71) Applicant: Faraday Technology Corp., Hsinchu (TW)

(72) Inventor: Yu-Hsin Tseng, Hsinchu (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 17/006,904

(22) Filed: Aug. 31, 2020

(30) Foreign Application Priority Data

May 20, 2020 (TW) .................................. 109116613

(51) Int. Cl.
| | | |
|---|---|---|
| *H03L 7/087* | (2006.01) | |
| *H04L 7/033* | (2006.01) | |
| *H03K 3/037* | (2006.01) | |
| *H03L 7/089* | (2006.01) | |
| *G06F 1/12* | (2006.01) | |

(52) U.S. Cl.
CPC .............. *H04L 7/0337* (2013.01); *G06F 1/12* (2013.01); *H03K 3/037* (2013.01); *H03L 7/087* (2013.01); *H03L 7/0891* (2013.01); *H03L 2207/50* (2013.01)

(58) Field of Classification Search
CPC ...... H04L 7/0337; H03L 7/087; H03L 7/0891
See application file for complete search history.

(56) References Cited

U.S. PATENT DOCUMENTS

| | | | |
|---|---|---|---|
| 7,142,621 B2 | 11/2006 | Vallet et al. | |
| 7,795,926 B2 * | 9/2010 | Tseng ...................... | H03L 7/089 327/9 |
| 7,929,644 B2 * | 4/2011 | McCune, Jr. ......... | H04L 7/0338 375/326 |
| 8,374,305 B2 | 2/2013 | Takada | |
| 8,629,699 B2 | 1/2014 | Wachi et al. | |
| 9,054,689 B2 | 6/2015 | Maruko | |
| 9,209,966 B1 | 12/2015 | Hossain et al. | |

OTHER PUBLICATIONS

"Office Action of Taiwan Counterpart Application", dated Jul. 28, 2020, pp. 1-5.

\* cited by examiner

*Primary Examiner* — Patrick O Neill
(74) *Attorney, Agent, or Firm* — JCIPRNET

(57) ABSTRACT

A clock data recovery circuit including a phase blender, a phase detector, a data sampling position detector and a data selector is provided. The phase blender generates a third clock signal and a fourth clock signal according to a first clock signal and a second clock signal. The phase detector samples a data signal according to the first and second clock signals to generate first sampled data, second sampled data and a phase state signal. The data sampling position detector samples the data signal according to the third and fourth clock signals to generate third sampled data, fourth sampled data and a control signal. The data selector generates output data according to the control signal and the phase state signal.

10 Claims, 12 Drawing Sheets

CLOCK DATA RECOVERY CIRCUIT

CROSS-REFERENCE TO RELATED APPLICATION

This application claims the priority benefit of Taiwan application no. 109116613, filed on May 20, 2020. The entirety of the above-mentioned patent application is hereby incorporated by reference herein and made a part of this specification.

BACKGROUND

Technical Field

The invention relates to a clock data recovery circuit, and particularly relates to a clock data recovery circuit capable of improving jitter tolerance.

Description of Related Art

During transmission of a data signal, a clock signal is often used in collaboration with the data signal for adjustment. However, in the process of transmission, the data signal may be offset from the corresponding clock signal due to jitter, resulting in that the data signal cannot be transmitted correctly.

In the conventional technology, a clock data recovery circuit is often used to overcome the above-mentioned problem. However, the conventional clock data recovery circuit often requires complex circuits or algorithms to perform an adjustment between the data signal and the clock signal, which increases design difficulties and circuit costs to a certain extent.

SUMMARY

The invention provides a clock data recovery circuit capable of improving jitter tolerance.

A clock data recovery circuit of the invention includes a phase blender, a phase detector, a data sampling position detector and a data selector. The phase blender generates a third clock signal and a fourth clock signal according to a first clock signal and a second clock signal. The phase detector samples a data signal according to the first clock signal and the second clock signal to generate first sampled data, second sampled data and a phase state signal. The data sampling position detector samples the data signal according to the third clock signal and the fourth clock signal to generate third sampled data, fourth sampled data and a control signal. The data selector selects one of the first sampled data, the second sampled data, the third sampled data and the fourth sampled data according to the control signal and the phase state signal to generate output data. Phases of the first clock signal, the second clock signal, the third clock signal and the fourth clock signal are different.

Based on the above, in the invention, data sampling is performed on a plurality of clock signals with different phases, and correct sampled data is selected according to a leading or lagging state of a data signal. Accordingly, correctness of the output data is improved through a simple structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
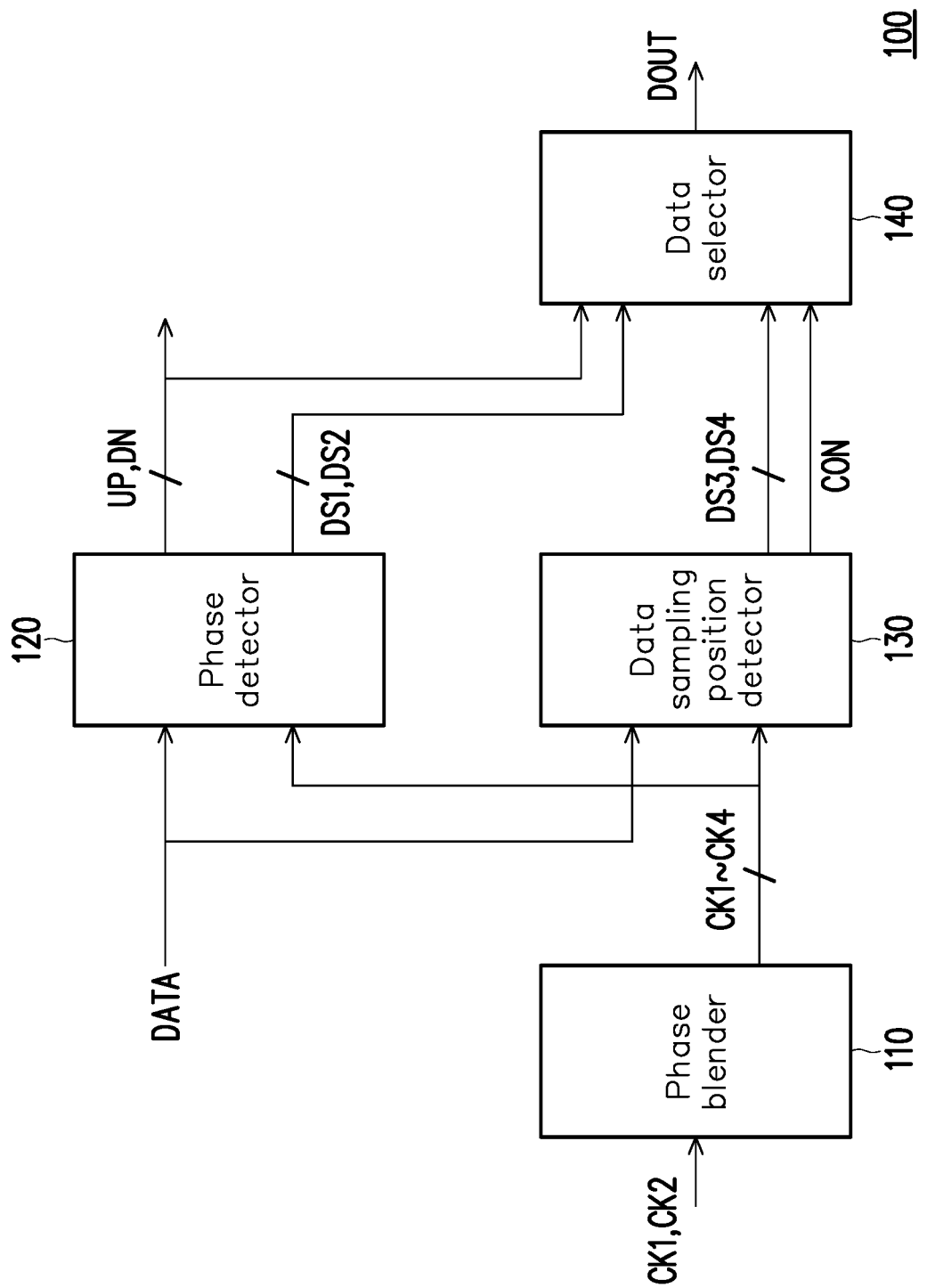
FIG. 1 is a schematic diagram of a clock data recovery circuit according to an embodiment of the invention.

Referring to FIG. 1, FIG. 1 is a schematic diagram of a clock data recovery circuit according to an embodiment of the invention. A clock data recovery circuit 100 includes a phase blender 110, a phase detector 120, a data sampling position detector 130 and a data selector 140. The phase blender 110 receives a first clock signal CK1 and a second clock signal CK2 with different phases, and generates a third clock signal CK3 and a fourth clock signal CK4 respectively according to the first clock signal CK1 and the second clock signal CK2. In the embodiment, the phases of the first clock signal CK1, the second clock signal CK2, the third clock signal CK3 and the fourth clock signal CK4 are all different, wherein the first clock signal CK1 and the third clock signal CK3 have a preset phase difference, the third clock signal CK3 and the second clock signal CK2 have the aforementioned preset phase difference, and the second clock signal CK2 and the fourth clock signal CK4 have the aforementioned preset phase difference.

In the embodiment, the phase blender 110 may delay the first clock signal CK1 to generate the third clock signal CK3, and delay the second clock signal CK2 to generate the fourth clock signal CK4. In detail, the phase blender 110 may delay the first clock signal CK1 and the second clock signal CK2 by the same delay amount. The first clock signal CK1, the second clock signal CK2, the third clock signal CK3 and the fourth clock signal CK4 may have a phase difference of 45 degrees in sequence.

Moreover, the phase detector 120 is coupled to the phase blender 110. The phase detector 120 receives the first clock signal CK1 and the second clock signal CK2, and receives a data signal DATA. The phase detector 120 samples the data signal DATA according to the first clock signal CK1 and the second clock signal CK2 to generate first sampled data DS1, second sampled data DS2 and a phase state signal. In the embodiment, the phase state signal includes a first phase state sub-signal DN and a second phase state sub-signal UP.

In the embodiment, the phase detector 120 may be a Bang Bang phase detector (BBPD), and the first phase state sub-signal DN and second phase state sub-signal UP it generates may respectively represent a phase leading state or a phase lagging state of the data signal DATA relative to the first clock signal CK1 and the second clock signal CK2.

The data sampling position detector 130 is coupled to the phase blender 110 and the phase detector 120. The data sampling position detector 130 receives the third clock signal CK3 and the fourth clock signal CK4, and samples the data signal DATA according to the third clock signal CK3 and the fourth clock signal CK4 to generate third sampled data DS3, fourth sampled data DS4 and a control signal CON. The data selector 140 is coupled to the phase detector 120 and the data sampling position detector 130. The data selector 140 receives the first sampled data DS1, the second sampled data DS2, the third sampled data DS3, the fourth sampled data DS4, the control signal CON, the first phase state sub-signal DN and the second phase state sub-signal UP. The data selector 140 selects one of the first sampled data DS1, the second sampled data DS2, the third sampled data DS3 and the fourth sampled data DS4 according to the control signal CON, the first phase state sub-signal DN and the second phase state sub-signal UP to generate output data DOUT. In the embodiment, the first sampled data DS1, the second sampled data DS2, the third sampled data DS3, and the fourth sampled data DS4 may be in a serial format, and the data selector 140 may output the output data DOUT that is also in the serial format, or generate the output data DOUT in a parallel format by a serial to parallel conversion.

Figure 2:
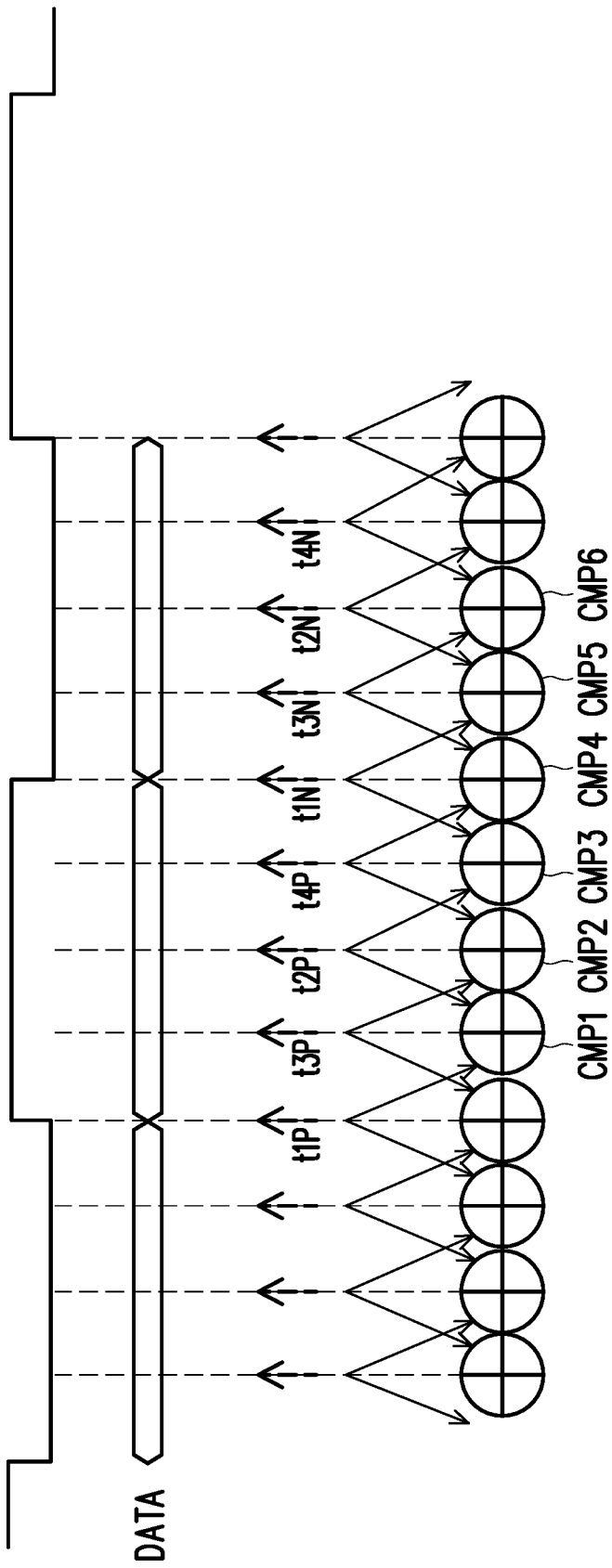
FIG. 2 is a schematic diagram of a data sampling operation of a clock data recovery circuit according to an embodiment of the invention.

Referring to FIG. 2, FIG. 2 is a schematic diagram of a data sampling operation of a clock data recovery circuit according to an embodiment of the invention. In the embodiment, all sampling operations on the data signal are carried out through dual transition edges (a rising edge and a falling edge) of the clock signal. In FIG. 2, the data signal DATA may be sampled sequentially through a rising edge OP of the first clock signal, a rising edge t3P of the third clock signal, a rising edge t2P of the second clock signal, a rising edge t4P of the fourth clock signal, a falling edge ON of the first clock signal, a falling edge t3N of the third clock signal, a falling edge t2N of the second clock signal, and a falling edge t4N of the fourth clock signal. Then, the sampled data are compared with each other by comparators CMP1 to CMP6. In detail, the comparator CMP1 compares the sampled data corresponding to the rising edge OP of the first clock signal with the sampled data corresponding to the rising edge t2P of the second clock signal; the comparator CMP2 compares the sampled data corresponding to the rising edge t3P of the third clock signal with the sampled data corresponding to the rising edge t4P of the fourth clock signal; the comparator CMP3 compares the sampled data corresponding to the rising edge t2P of the second clock signal with the sampled data corresponding to the falling edge ON of the first clock signal; the comparator CMP4 compares the sampled data corresponding to the rising edge t4P of the fourth clock signal with the sampled data corresponding to the falling edge t3N of the third clock signal; the comparator CMP5 compares the sampled data corresponding to the falling edge ON of the first clock signal with the sampled data corresponding to the falling edge t2N of the second clock signal; and the comparator CMP6 compares the sampled data corresponding to the falling edge t3N of the third clock signal with the sampled data corresponding to the falling edge t4N of the fourth clock signal. The leading or lagging state of the data signal DATA is determined according to comparison results of the comparators CMP1 to CMP6.

Figure 3:
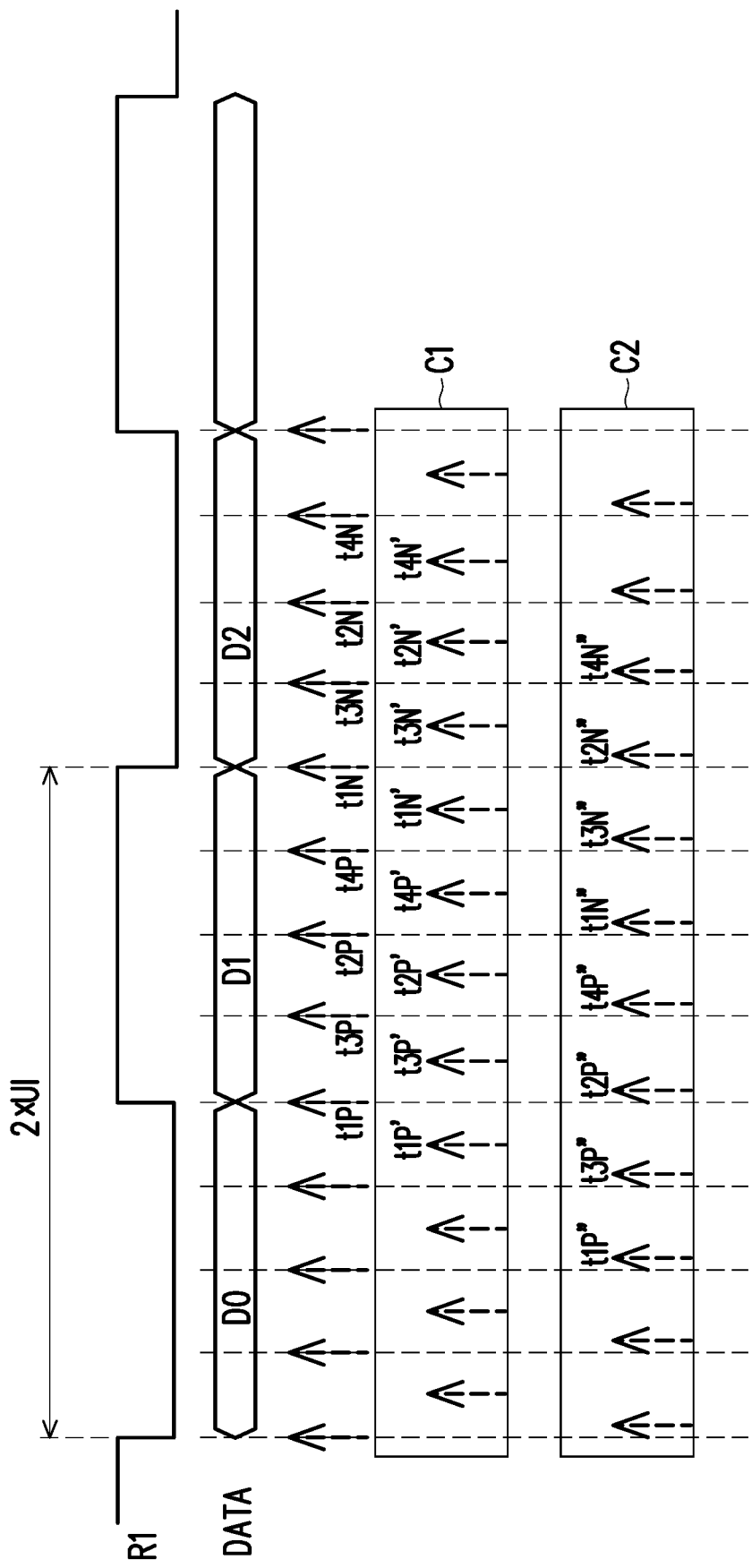
FIG. 3 and FIG. 4 are schematic diagrams of a plurality of implementations of data sampling according to an embodiment of the invention.
Figure 4:
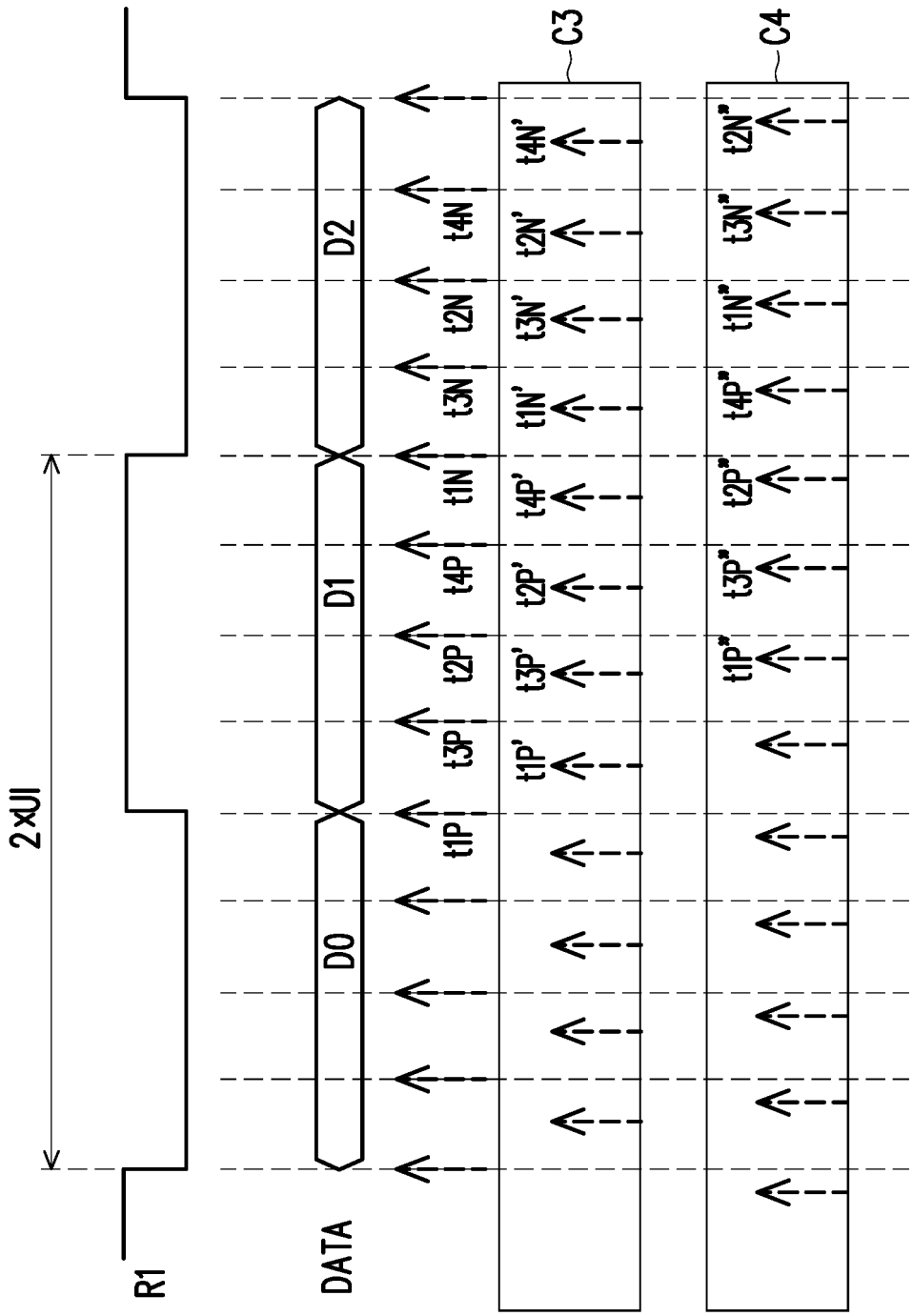

Referring to FIG. 3 and FIG. 4, FIG. 3 and FIG. 4 are schematic diagrams of a plurality of implementations of data sampling according to an embodiment of the invention. FIG. 3 is illustrated based on a reference signal R1, where one cycle of the reference signal R1 may be regarded as 2 unit intervals (UI). In an ideal state, the data signal DATA may be sampled based on the rising edge OP and the falling edge ON of the first clock signal, the rising edge t2P and the falling edge t2N of the second clock signal, the rising edge t3P and the falling edge t3N of the third clock signal, and the rising edge t4P and the falling edge t4N of the fourth clock signal.

When there is an offset between the data signal DATA and the clock signal (i.e., the clock signal is ahead of the data signal DATA), states C1 and C2, for example, are achieved.

In the state C1, the data signal DATA and the clock signal have an offset of 0 to ¼ unit interval UI. At this time, the data signal DATA is sampled based on a rising edge OP' and a falling edge ON' of the offset first clock signal, a rising edge t2P' and a falling edge t2N' of the offset second clock signal, a rising edge t3P' and a falling edge t3N' of the offset third clock signal, and a rising edge t4P' and a falling edge t4N' of the offset fourth clock signal. Moreover, the control signal (for example, having a logic level 1) may be generated by comparing the sampled data (equal to data D1) corresponding to the rising edge t4P' of the fourth clock signal with the sampled data (equal to data D1) corresponding to the rising edge t3P' of the third clock signal. Based on the fact that the control signal has the logic level 1, the sampled data corresponding to the rising edge t4P' of the offset fourth clock signal may be selected as the output data.

In the state C2, the data signal DATA and the clock signal have an offset of ¼ to ½ unit interval UI. At this time, the data signal DATA is sampled based on a rising edge OP" and a falling edge ON" of the offset first clock signal, a rising edge t2P" and a falling edge t2N" of the offset second clock signal, a rising edge t3P" and a falling edge t3N" of the offset third clock signal, and a rising edge t4P" and a falling edge t4N" of the offset fourth clock signal. Moreover, the control signal (for example, having a logic level 0) may be generated by comparing the sampled data (equal to the data D1) corresponding to the rising edge t4P" of the fourth clock signal with the sampled data (equal to data D0) corresponding to the rising edge t3P" of the third clock signal. Based on the fact that the control signal has the logic level 0, the sampled data corresponding to the falling edge ON" of the offset first clock signal may be selected as the output data.

In FIG. 4, when there is an offset between the data signal DATA and the clock signal (i.e., the clock signal lags behind the data signal DATA), states C3 and C4, for example, are achieved.

In the state C3, the data signal DATA and the clock signal have an offset of 0 to ¼ unit interval UI. At this time, the data signal DATA is sampled based on the rising edge OP' and the falling edge ON' of the offset first clock signal, the rising edge t2P' and the falling edge t2N' of the offset second clock signal, the rising edge t3P' and the falling edge t3N' of the offset third clock signal, and the rising edge t4P' and the falling edge t4N' of the offset fourth clock signal. Moreover, the control signal (for example, having the logic level 1) may be generated by comparing the sampled data (equal to the data D1) corresponding to the rising edge t4P' of the fourth clock signal with the sampled data (equal to data D1) corresponding to the rising edge t3P' of the third clock signal. Based on the fact that the control signal has the logic level 1, the sampled data corresponding to the rising edge t2P' of the offset second clock signal may be selected as the output data.

In the state C4, the data signal DATA and the clock signal have an offset of ¼ to ½ unit interval UI. At this time, the data signal DATA is sampled based on the rising edge OP''' and the falling edge ON''' of the offset first clock signal, the rising edge t2P''' and the falling edge t2N''' of the offset second clock signal, the rising edge t3P''' and the falling edge t3N''' of the offset third clock signal, and the rising edge t4P''' and the falling edge t4N''' of the offset fourth clock signal. Moreover, the control signal (for example, having the logic level 0) may be generated by comparing the sampled data (equal to the data D1) corresponding to the rising edge t4P''' of the fourth clock signal with the sampled data (equal to the data D0) corresponding to the rising edge t3P''' of the third clock signal. Based on the fact that the control signal has the logic level 0, the sampled data corresponding to the rising edge t3P''' of the offset third clock signal may be selected as the output data.

Figure 5:
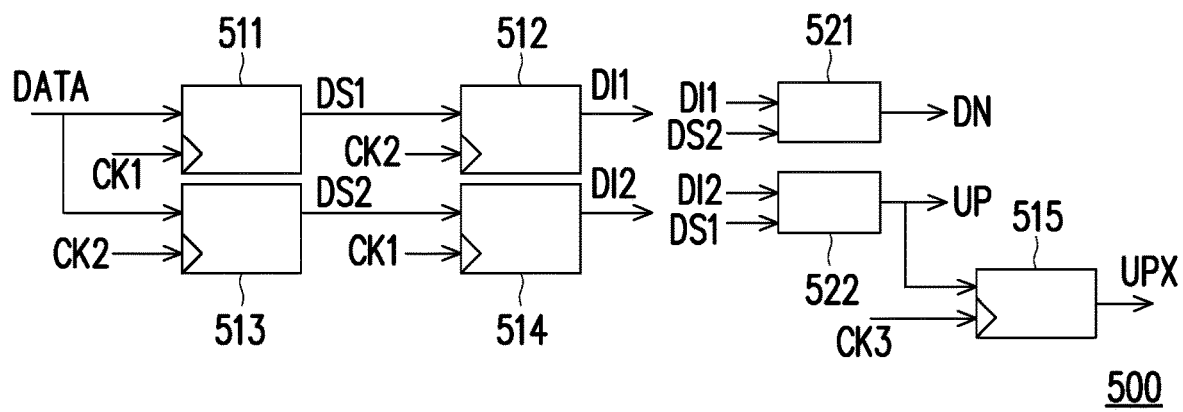
FIG. 5 is a schematic diagram of a phase detector according to an embodiment of the invention.

Referring to FIG. 5, FIG. 5 is a schematic diagram of a phase detector according to an embodiment of the invention. A phase detector 500 includes dual-edge triggered flip-flops 511 to 515 and a comparison circuit composed of XOR gates 521 and 522. The dual-edge triggered flip-flop 511 samples the data signal DATA according to the rising edge and the falling edge of the first clock signal CK1, so as to generate the first sampled data DS1. The dual-edge triggered flip-flop 512 is coupled to an output terminal of the dual-edge triggered flip-flop 511, and samples the first sampled data DS1 according to the rising edge and the falling edge of the second clock signal CK2, so as to generate fifth sampled data DI1.

On the other hand, the dual-edge triggered flip-flop 513 samples the data signal DATA according to the rising edge and the falling edge of the second clock signal CK2, so as to generate the second sampled data DS2. The dual-edge triggered flip-flop 514 is coupled to an output terminal of the dual-edge triggered flip-flop 513. The dual-edge triggered flip-flop 514 samples the second sampled data DS2 according to the rising edge and the falling edge of the first clock signal CK1, so as to generate sixth sampled data DI2.

The XOR gate 521 receives the second sampled data DS2 and the fifth sampled data DI1, and compares the second sampled data DS2 with the fifth sampled data DI1 to generate the first phase state sub-signal DN. The XOR gate 522 receives the first sampled data DS1 and the sixth sampled data DI2, and compares the first sampled data DS1 with the sixth sampled data DI2 to generate the second phase state sub-signal UP.

Incidentally, the dual-edge triggered flip-flop 515 receives the second phase state sub-signal UP, and samples the second phase state sub-signal UP according to the third clock signal CK3 to generate a synchronized second phase state sub-signal UPX. The synchronized second phase state sub-signal UPX may be synchronized with the third clock signal CK3 to facilitate subsequent circuit processing.

In the embodiment, a relationship between the first clock signal CK1 to the third clock signal CK3 is the same as that of the embodiment of FIG. 1, and will not be repeated.

Figure 6:
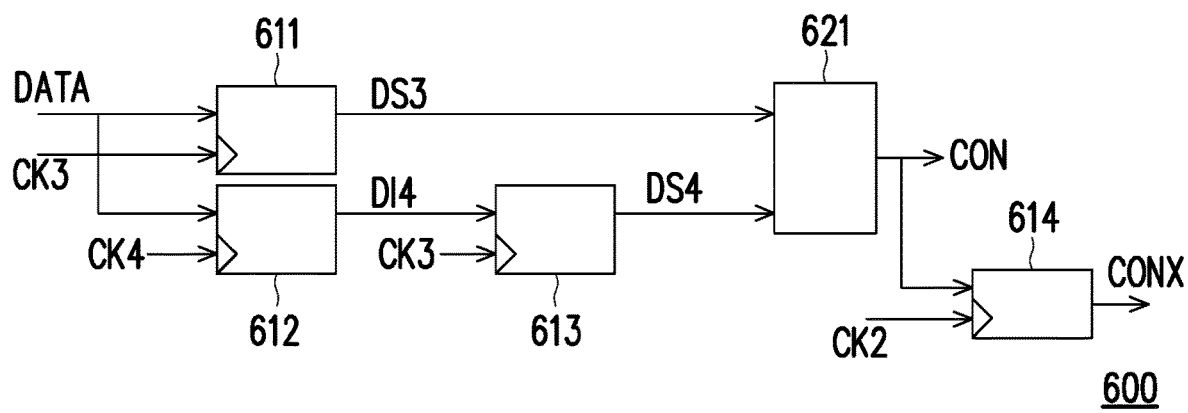
FIG. 6 is a schematic diagram of a data sampling position detector according to an embodiment of the invention.

Referring to FIG. 6, FIG. 6 is a schematic diagram of a data sampling position detector according to an embodiment of the invention. A data sampling position detector 600 includes dual-edge triggered flip-flops 611 to 614 and a comparator composed of an XOR gate 621. The dual-edge triggered flip-flop 611 samples the data signal DATA according to the rising edge and the falling edge of the third clock signal CK3, so as to generate the third sampled data DS3. The dual-edge triggered flip-flop 612 samples the data signal DATA according to the rising edge and the falling edge of the fourth clock signal CK4, so as to generate metadata DI4. Moreover, the dual-edge triggered flip-flop 613 samples the metadata DI4 according to the rising edge and the falling edge of the third clock signal CK3, so as to generate the fourth sampled data DS4. Through the dual-edge triggered flip-flop 613, the fourth sampled data DS4 and the third sampled data DS3 may both be synchronized with the third clock signal CK3.

The XOR gate 621 receives the fourth sampled data DS4 and the third sampled data DS3, and generates the control signal CON by comparing the fourth sampled data DS4 with the third sampled data DS3. Incidentally, the dual-edge triggered flip-flop 614 may receive the control signal CON, and sample the control signal CON according to the second clock signal CK2 to generate a synchronized control signal CONX.

Operation details of a clock data recovery circuit according to an embodiment of the invention may be understood with reference to FIG. 5, FIG. 6 and FIG. 7A to FIG. 7D, where FIG. 7A to FIG. 7D are operation waveform diagrams of the clock data recovery circuit according to an embodiment of the invention.

Figure 7A:
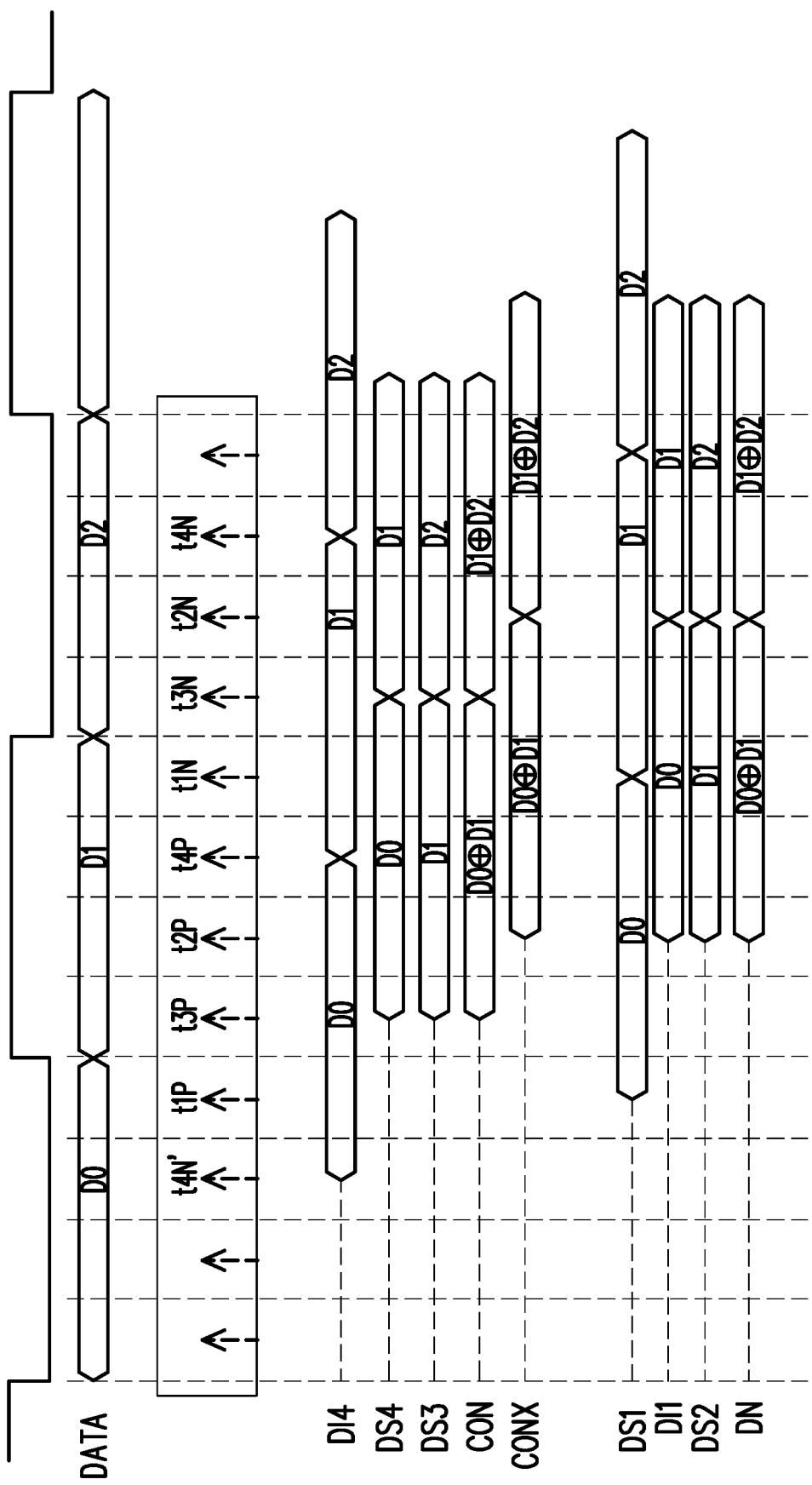
FIG. 7A to FIG. 7D are operation waveform diagrams of a clock data recovery circuit according to an embodiment of the invention.

In FIG. 7A, the data signal DATA and the clock signal (CK1 to CK4) have an offset of 0 to ¼ unit interval UI (i.e., the clock signal is ahead of the data signal DATA). The data signal DATA is originally the data D0, and is changed to the data D1 before occurrence of the rising edge t3P of the third clock signal CK3, and is changed to data D2 before occurrence of the falling edge t3N of the third clock signal CK3.

Moreover, the dual-edge triggered flip-flop 612 may sample the data signal DATA according to the falling edge t4N' of the fourth clock signal CK4 to obtain the metadata DI4 having the data D0. By sampling the data signal DATA by the dual-edge triggered flip-flop 511 according to the rising edge OP of the first clock signal CK1, the first sampled data DS1 having the data D0 is obtained. Then, according to the rising edge t3P of the third clock signal CK3, the dual-edge triggered flip-flop 611 may generate the third sampled data DS3 having the data D1, and the dual-edge triggered flip-flop 613 may generate the fourth sampled data DS4 having the data D0. Meanwhile, the XOR gate 621 may perform an XOR operation on the third sampled data DS3 and the fourth sampled data DS4 to generate the control signal CON. When the rising edge t2P of the second clock signal CK2 occurs, the data of the synchronized control signal CONX is a result of an XOR operation on the data D0 and the data D1.

The dual-edge triggered flip-flops 512 and 513 synchronously sample the first sampled data DS1 and the data signal DATA according to the rising edge t2P of the second clock signal CK2 and respectively generate the fifth sampled data DI1 and the second sampled data DS2. In the embodiment, the fifth sampled data DI1 and the second sampled data DS2 are respectively the data D0 and the data D1. Correspondingly, the XOR gate 521 performs an XOR operation on the data D0 and the data D1 and generates the first phase state sub-signal DN.

When the falling edge ON of the first clock signal CK1 occurs, the first sampled data DS1 is changed to the data D1. When the falling edge t3N of the third clock signal CK3 occurs, the third sampled data DS3 and the fourth sampled data DS4 are respectively changed to the data D2 and the data D1, and the control signal CON is correspondingly changed to a result of an XOR operation on the data D2 and the data D1. When the falling edge t2N of the second clock signal CK2 occurs, the data of the synchronized control signal CONX is the result of the XOR operation on the data D2 and the data D1.

On the other hand, when the falling edge t2N of the second clock signal CK2 occurs, the fifth sampled data DI1 and the second sampled data DS2 are respectively changed to the data D1 and the data D2. The first phase state sub-signal DN is changed to the result of the XOR operation on the data D1 and the data D2.

Figure 7B:
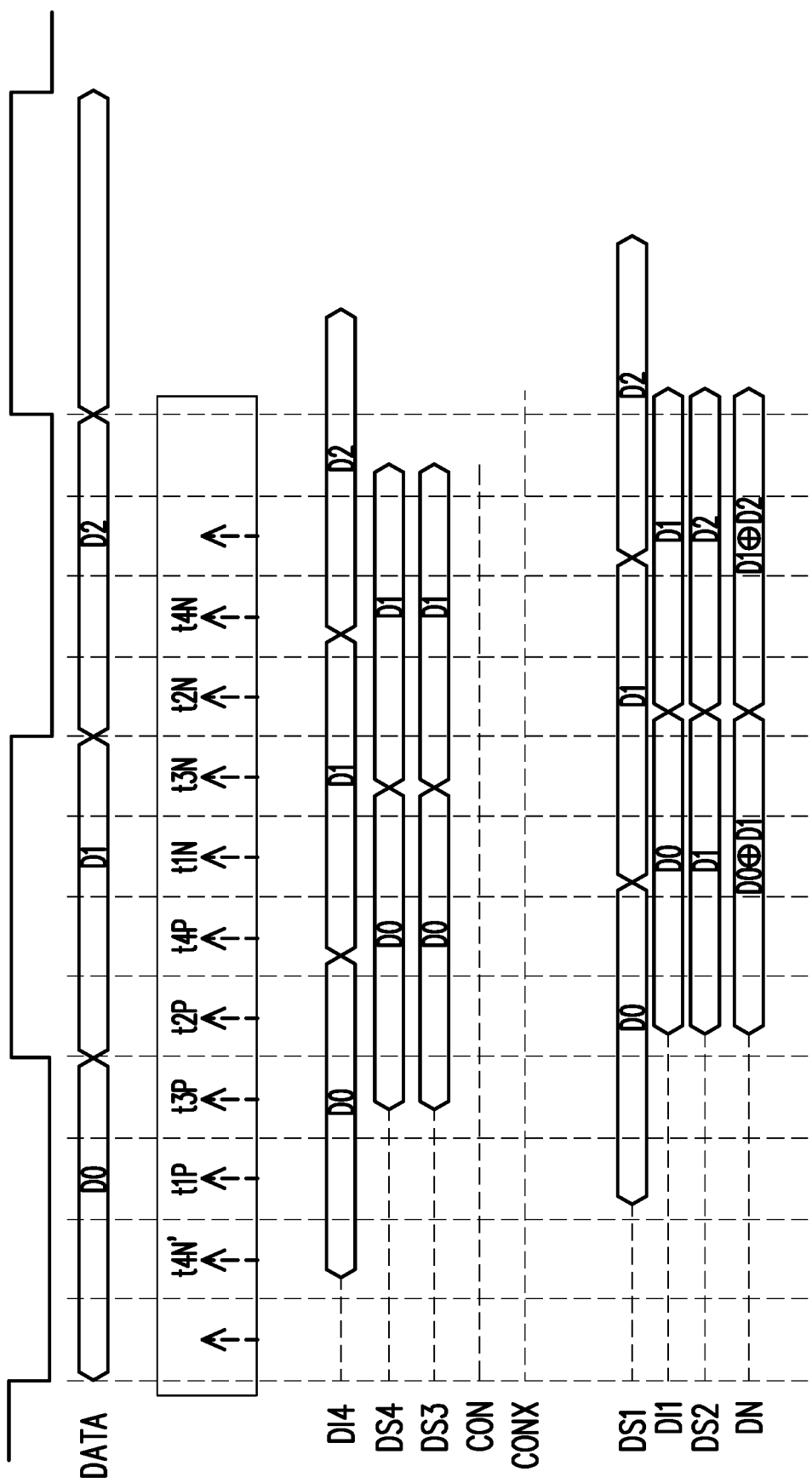

In FIG. 7B, the data signal DATA and the clock signal (CK1 to CK4) have an offset of ¼ to ½ unit interval UI (i.e., the clock signal is ahead of the data signal DATA). The data signal DATA is originally the data D0, and is changed to the data D1 before occurrence of the rising edge t2P of the second clock signal CK2, and is changed to the data D2 before occurrence of the falling edge t2N of the second clock signal CK2.

Unlike the embodiment of FIG. 7A, when the rising edge t3P of the third clock signal CK3 occurs, the third sampled data DS3 and the fourth sampled data DS4 are synchronously the data D0, and when the falling edge t3N of the third clock signal CK3 occurs, the third sampled data DS3 and the fourth sampled data DS4 are synchronously changed to the data D1. Namely, the third sampled data DS3 and the fourth sampled data DS4 of the embodiment are maintained identical. Correspondingly, the control signal CON and the synchronized control signal CONX are maintained at the logic level 0.

Figure 7C:
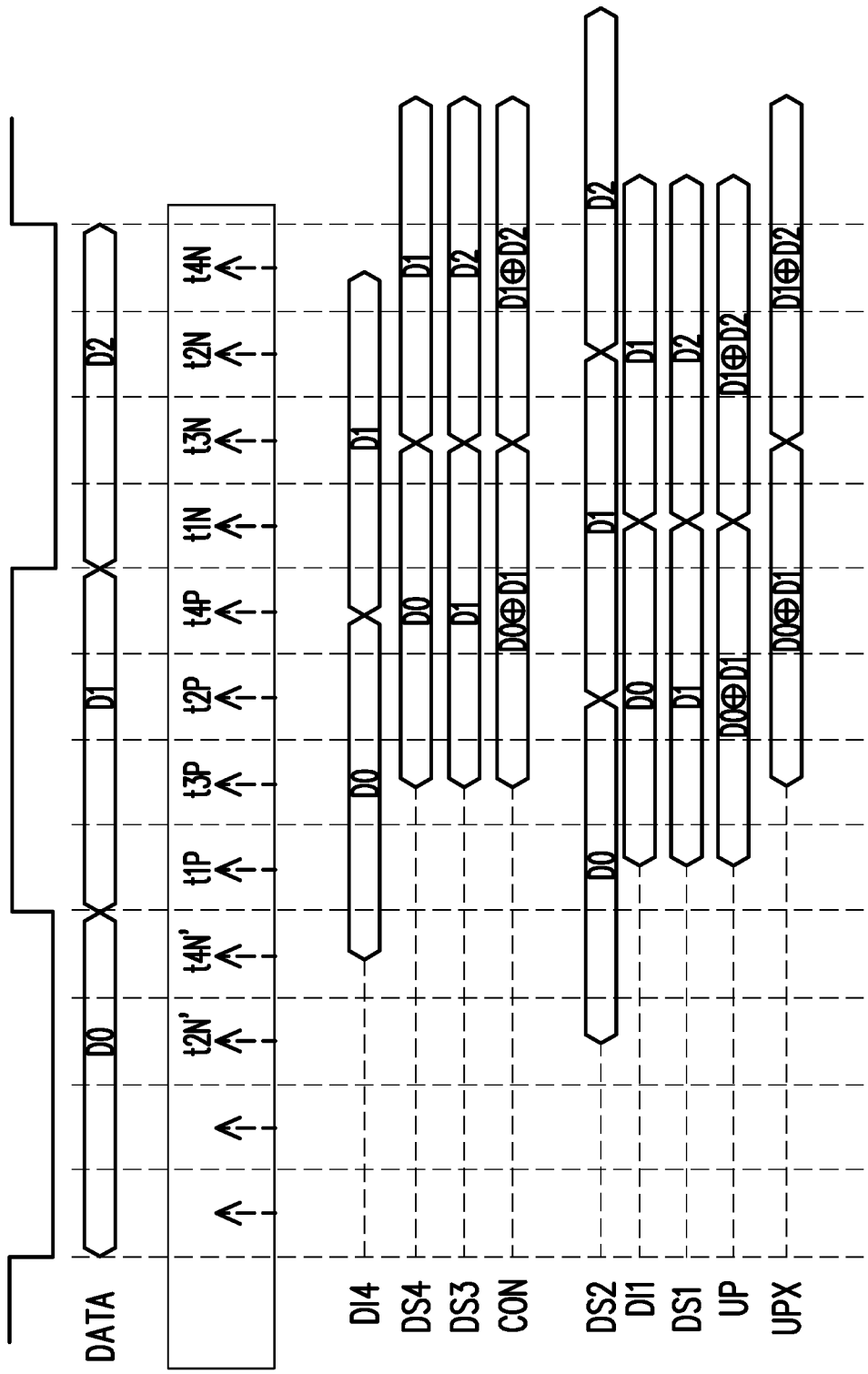

In FIG. 7C, the data signal DATA and the clock signal (CK1 to CK4) have an offset of 0 to ¼ unit interval UI (i.e., the clock signal lags behind the data signal DATA). The data signal DATA is originally the data D0, and is changed to the data D1 before occurrence of the rising edge OP of the first clock signal CK1, and is changed to the data D2 before occurrence of the falling edge ON of the first clock signal CK1. When the falling edge t2N' of the second clock signal CK2 occurs, the second sampled data DS2 is changed to the data D0, and when the falling edge t4N' of the fourth clock signal CK4 occurs, the metadata DI4 is also changed to the data D0. Then, when the rising edge OP of the first clock signal CK1 occurs, the first sampled data DS1 and the fifth sampled data DI1 are synchronously changed to the data D1 and the data D0, respectively. Correspondingly, the data of the second phase state sub-signal UP is equal to the result of the XOR operation on the data D1 and the data D0.

When the rising edge t3P of the third clock signal CK3 occurs, the fourth sampled data DS4 and the third sampled data DS3 are respectively changed to the data D0 and the data D1. Correspondingly, the data of the control signal CON is equal to the result of the XOR operation on the data D1 and the data D0. When the rising edge t2P of the second clock signal CK2 occurs, the second sampled data DS2 is changed to the data D1.

Then, when the rising edge t4P of the fourth clock signal CK4 occurs, the metadata DI4 is changed to the data D1, and when the falling edge ON of the subsequent first clock signal CK1 occurs, the fifth sampled data DI1 and the first sampled data DS1 are respectively changed to the data D1 and the data D2, and the data of the second phase state sub-signal UP is equal to the result of the XOR operation on the data D1 and the data D2. Moreover, when the falling edge t3N of the subsequent third clock signal CK3 occurs, the synchronized second phase state sub-signal UPX is changed to the result of the XOR operation on the data D1 and the data D2.

Moreover, when the falling edge t3N of the third clock signal CK3 occurs, the fourth sampled data DS4 and the third sampled data DS3 are respectively changed to the data D1 and the data D2, and the control signal CON is changed to the result of the XOR operation on the data D1 and the data D2. When the falling edge t2N of the second clock signal CK2 occurs, the second sampled data DS2 is changed to the data D2.

Figure 7D:
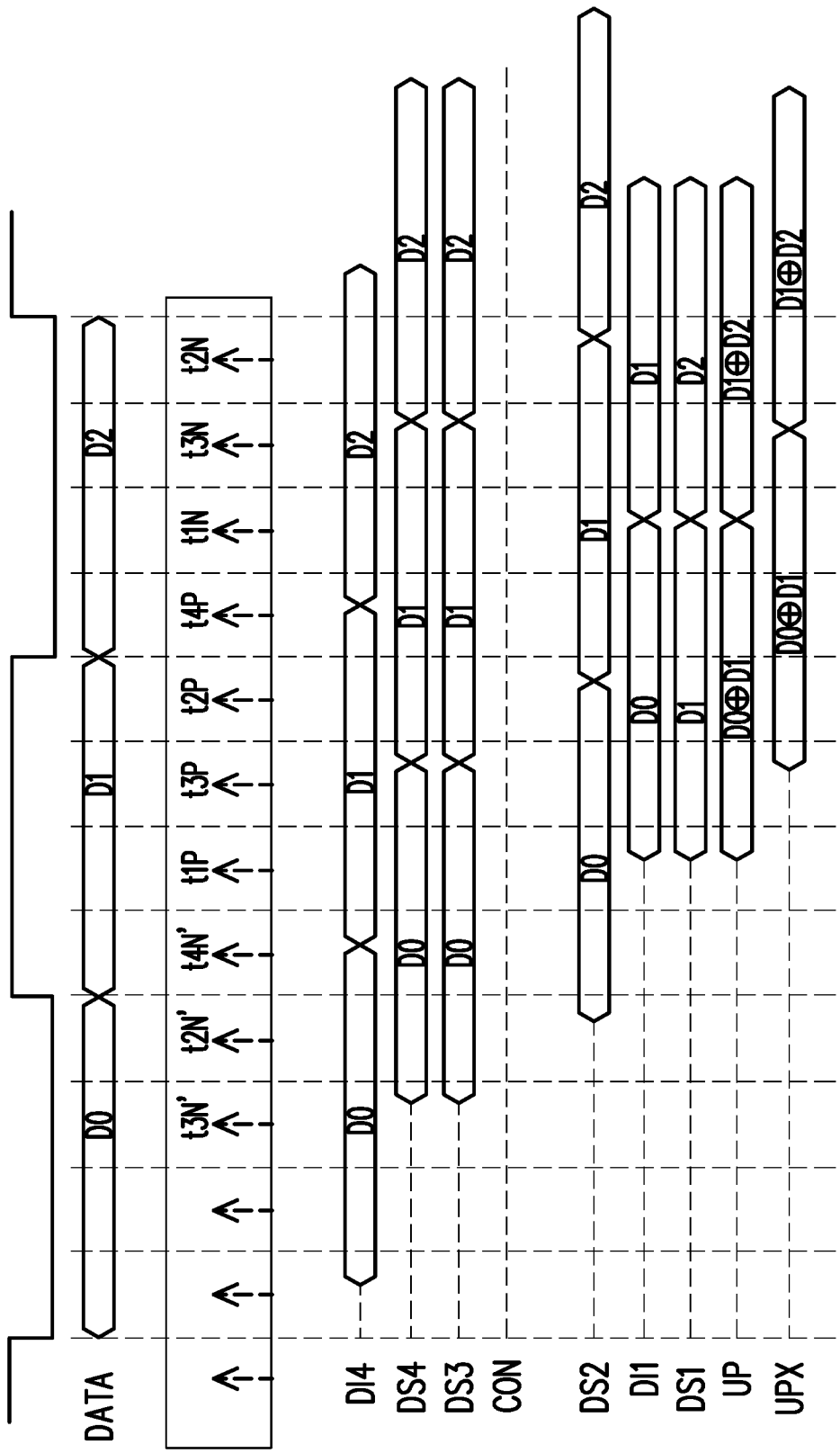

In FIG. 7D, the data signal DATA and the clock signal (CK1 to CK4) have an offset of ¼ to ½ unit interval UI (i.e., the clock signal lags behind the data signal DATA). The data signal DATA is originally the data D0, and is changed to the data D1 before occurrence of the falling edge t4N of the fourth clock signal CK4, and is changed to the data D2 before occurrence of the rising edge t4P of the fourth clock signal CK4. When the falling edge t3N' of the third clock signal CK3 occurs, the third sampled data DS3 and the fourth sampled data DS4 are both changed to the data D0. When the falling edge t2N' of the second clock signal CK2 occurs, the second sampled data DS2 is changed to the data D1. Then, when the falling edge t4N' of the fourth clock signal CK4 occurs, the metadata DI4 is also changed to the data D0.

Moreover, when the rising edge OP of the first clock signal CK1 occurs, the first sampled data DS1 and the fifth sampled data DI1 are synchronously changed to the data D1 and the data D0, respectively. Correspondingly, the data of the second phase state sub-signal UP is equal to the result of the XOR operation on the data D1 and the data D0.

When the rising edge t3P of the third clock signal CK3 occurs, the fourth sampled data DS4 and the third sampled data DS3 are both changed to the data D1. Correspondingly, the control signal CON has the logic level 0. When the rising edge t2P of the second clock signal CK2 occurs, the second sampled data DS2 is changed to the data D1.

Then, when the rising edge t4P of the fourth clock signal CK4 occurs, the metadata DI4 is changed to the data D2, and when the falling edge ON of the subsequent first clock signal CK1 occurs, the fifth sampled data DI1 and the first sampled data DS1 are respectively changed to the data D1 and the data D2, and the data of the second phase state sub-signal UP is equal to the result of the XOR operation on the data D1 and the data D2. Moreover, when the falling edge t3N of the subsequent third clock signal CK3 occurs, the synchronized second phase state sub-signal UPX is changed to the result of the XOR operation on the data D1 and the data D2.

In addition, when the falling edge t3N of the third clock signal CK3 occurs, the fourth sampled data DS4 and the third sampled data DS3 are both changed to the data D2, and the control signal CON remains at the logic level 0. When the falling edge t2N of the second clock signal CK2 occurs, the second sampled data DS2 is changed to the data D2.

It should be noted that the XOR operation in the above embodiment may be used to compare whether two pieces of data are identical. In the embodiment, when the two pieces of data in the XOR operation are identical, the correspondingly generated result of the XOR operation is at the logic level 0. Conversely, when the two pieces of data in the XOR operation are not identical, the correspondingly generated result of the XOR operation is at the logic level 1.

Figure 8:
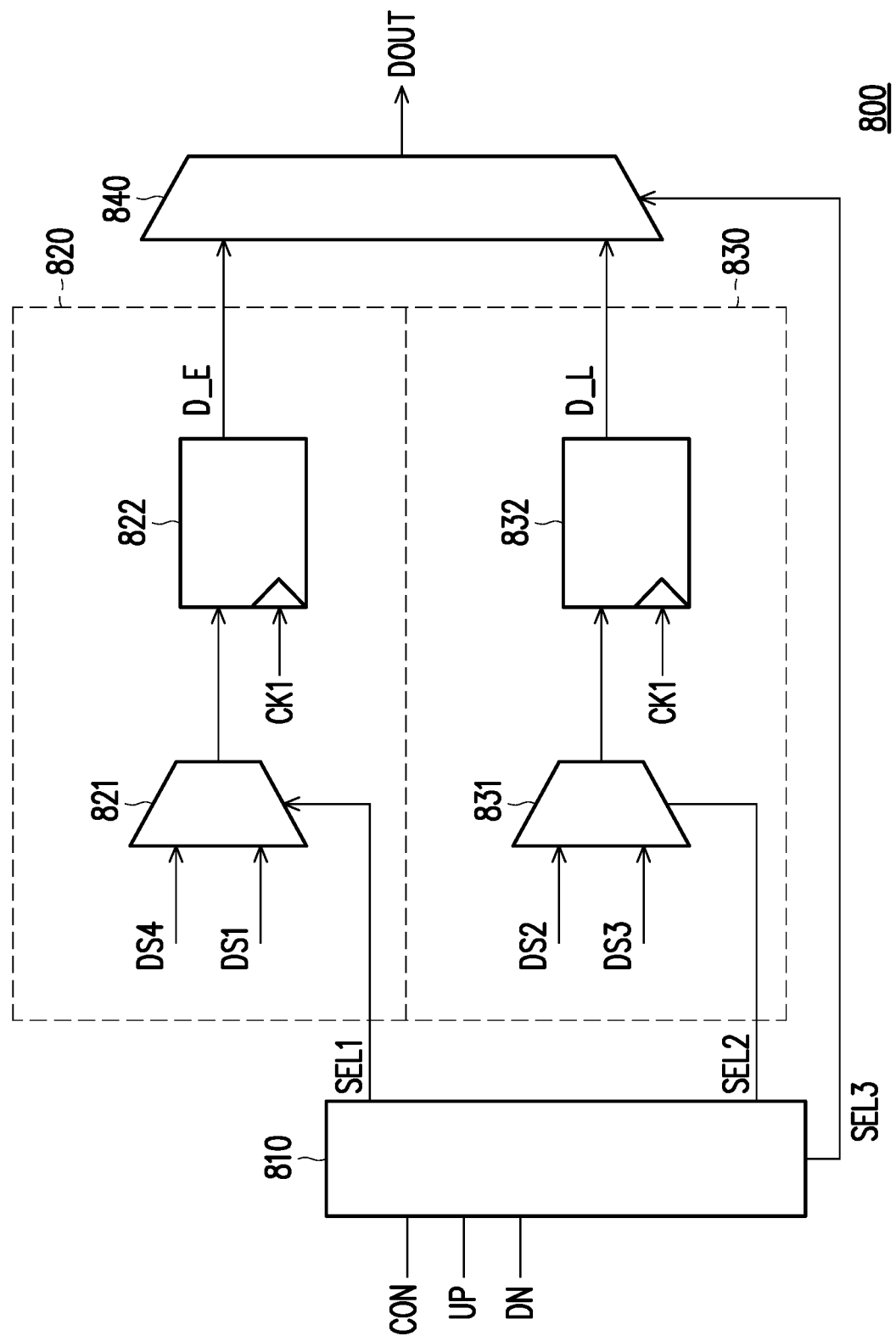
FIG. 8 is a schematic diagram of an implementation of a data selector in a clock data recovery circuit according to an embodiment of the invention.

Referring to FIG. 8, FIG. 8 is a schematic diagram of an implementation of a data selector in a clock data recovery circuit according to an embodiment of the invention. A data selector 800 includes a selection signal generator 810, a leading data generator 820, a lagging data generator 830, and a selector 840. The selection signal generator 810 generates selection signals SEL1 to SEL3 according to the control signal CON, the first phase state sub-signal DN and the second phase state sub-signal UP. The leading data generator 820 is coupled to the selection signal generator 810. The leading data generator 820 selects one of the fourth sampled data DS4 and the first sampled data DS1 according to the selection signal SEL1 to generate selected data D_E. The lagging data generator 830 is coupled to the selection signal generator 810. The lagging data generator 830 selects one of the third sampled data DS3 and the second sampled data DS2 according to the selection signal SEL2 to generate selected data D_L. The selector 840 is coupled to the leading data generator 820, the lagging data generator 830, and the selection signal generator 810. The selector 840 selects one of the selected data D_E and the selected data D_L according to the selection signal SEL3 to generate the output data DOUT.

In this implementation, the leading data generator 820 includes a multiplexer 821 and a dual-edge triggered flip-flop 822. The multiplexer 821 receives the fourth sampled data DS4, the first sampled data DS1, and the selection signal SEL1 The multiplexer 821 selects and outputs one of the fourth sampled data DS4 and the first sampled data DS1 according to the selection signal SELL. The dual-edge triggered flip-flop 822 samples the output of the multiplexer 821 according to the rising edge and the falling edge of the first clock signal CK1, so as to generate the selected data D_E.

The lagging data generator 830 includes a multiplexer 831 and a dual-edge triggered flip-flop 832. The multiplexer 831 receives the second sampled data DS2, the third sampled data DS3, and the selection signal SEL2. The multiplexer 831 selects and outputs one of the second sampled data DS2 and the third sampled data DS3 according to the selection signal SEL2. The dual-edge triggered flip-flop 832 samples the output of the multiplexer 831 according to the rising edge and the falling edge of the first clock signal CK1, so as to generate the selected data D_L.

Figure 9:
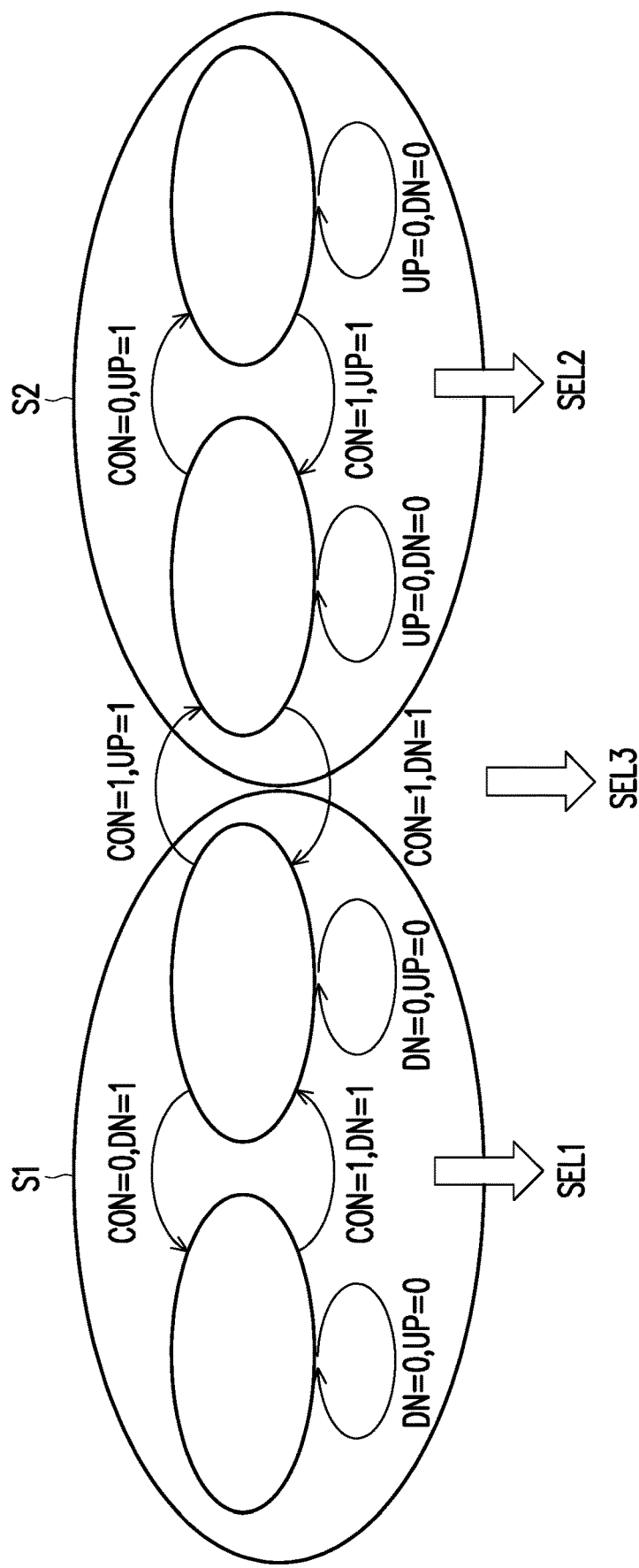
FIG. 9 a state machine flowchart of a selection signal generator according to an embodiment of the invention.

In the embodiment, the selection signal generator 810 may be a state machine circuit. A method of generating the selection signals SEL1 to SEL3 may be understood by referring to a state machine flowchart of a selection signal generator according to an embodiment of the invention as shown in FIG. 9. The selection signal generator 810 in a first sub-state ES1 of a leading state S1 enters a second sub-state ES2 of the leading state S1 when the control signal CON is at a first logic level (for example, the logic level 0) and the first phase state sub-signal DN is at a second logic level (for example, the logic level 1). The selection signal generator 810 in the first sub-state ES1 of the leading state S1 enters a first sub-state LS1 of a lagging state S2 when the control signal CON and the second phase state sub-signal UP are both at the second logic level. Moreover, the selection signal generator 810 in the second sub-state ES2 of the leading state S1 enters the first sub-state ES1 of the leading state S1 when the control signal CON and the first phase state sub-signal DN are both at the second logic level.

Moreover, the selection signal generator 810 in the first sub-state LS1 of the lagging state S2 enters the second sub-state ES2 of the leading state S1 when the control signal CON and the first phase state sub-signal DN are both at the second logic level. The selection signal generator 810 in the first sub-state LS1 of the lagging state S2 enters the second sub-state LS2 of the lagging state S2 when the control signal CON is at the first logic level and the second phase state sub-signal UP is at the second logic level. The selection signal generator 810 in the second sub-state LS2 of the lagging state S2 enters the first sub-state LS1 of the lagging state S2 when the control signal CON and the second phase state sub-signal UP are both at the second logic level.

On the other hand, the selection signal generator 810 generates the selection signal SEL1 of the second logic level in the first sub-state ES1 of the leading state S1, generates the selection signal SEL1 of the first logic level in the second sub-state ES2 of the leading state S1, generates the selection signal SEL2 of the second logic level in the first sub-state LS1 of the lagging state S2, generates the selection signal SEL2 of the first logic level in the second sub-state LS2 of the lagging state S2, generates the selection signal SEL3 of the second logic level in the leading state S1, and generates the selection signal SEL3 of the first logic level in the lagging state S2.

Figure 10:
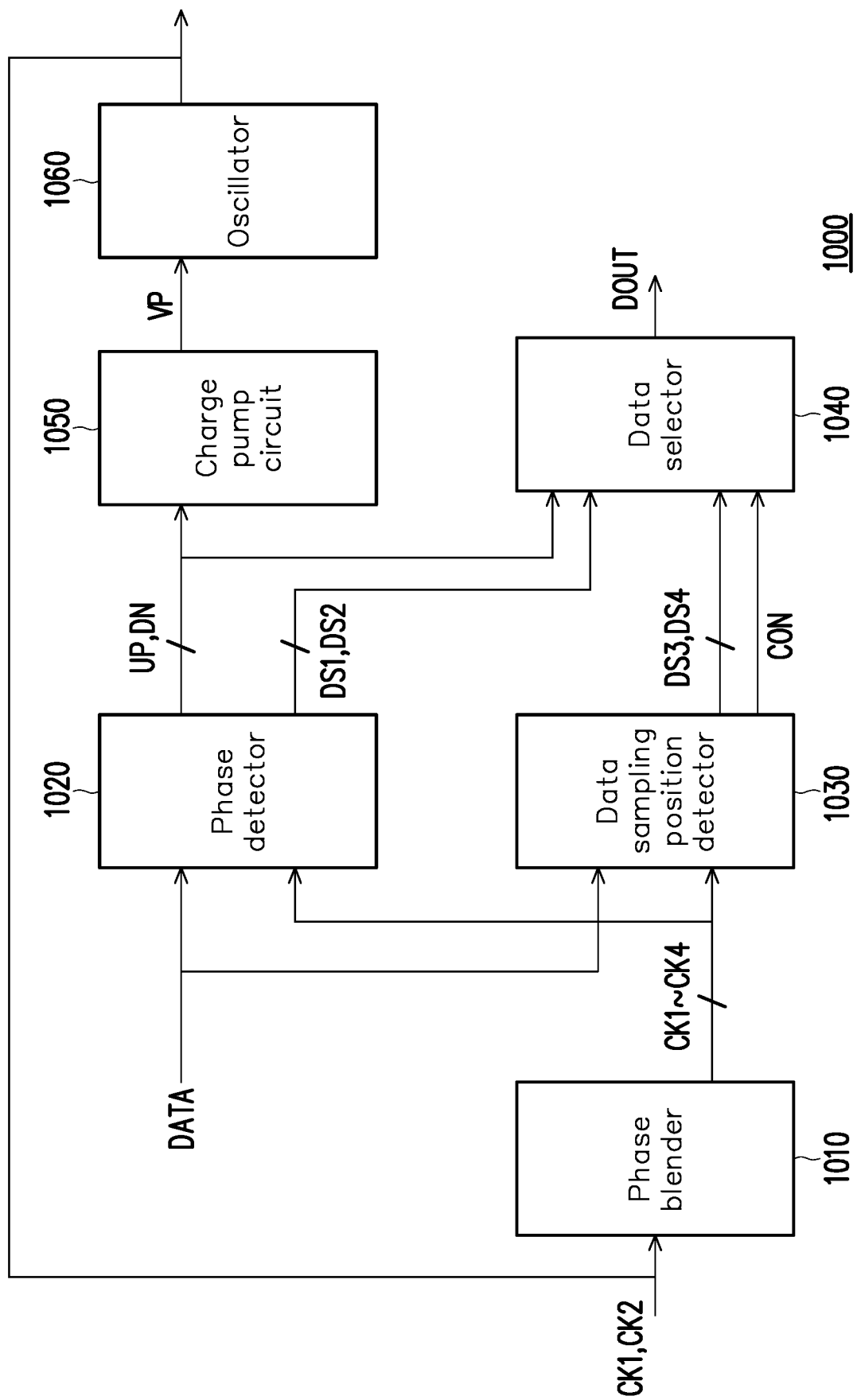
FIG. 10 is a schematic diagram of a clock data recovery circuit according to another embodiment of the invention.

Referring to FIG. 10, FIG. 10 is a schematic diagram of a clock data recovery circuit according to another embodiment of the invention. A clock data recovery circuit 1000 includes a phase blender 1010, a phase detector 1020, a data sampling position detector 1030, a data selector 1040, a charge pump circuit 1050, and an oscillator 1060. Different from the embodiment of FIG. 1 is that the charge pump circuit 1050 is configured to receive the first sub-phase state signal DN and the second sub-phase state signal UP, and adjust a voltage value of a pumping voltage VP according to the first sub-phase state signal DN and the second sub-phase state signal UP. The oscillator 1060 is coupled to the charge pump circuit 1050, and adjusts a frequency of the first clock signal CK1 (and the second clock signal CK2) according to the voltage value of the pumping voltage VP. In the embodiment, the oscillator 1060 may be a voltage controlled oscillator.

In summary, in the invention, a plurality of clock signals are generated, and a data signal is sampled according to the rising edges and falling edges of the clock signals, so as to determine an offset state between the clock signals and the data signal, and accordingly select the correct output data. In this way, the clock data recovery circuit has relatively large jitter tolerance and maintains data correctness.

What is claimed is:

1. A clock data recovery circuit, comprising:
   a phase blender, generating a third clock signal and a fourth clock signal according to a first clock signal and a second clock signal;
   a phase detector, sampling a data signal according to the first clock signal and the second clock signal to generate first sampled data, second sampled data and a phase state signal;
   a data sampling position detector, sampling the data signal according to the third clock signal and the fourth clock signal to generate third sampled data, fourth sampled data and a control signal; and
   a data selector, selecting one of the first sampled data, the second sampled data, the third sampled data and the fourth sampled data according to the control signal and the phase state signal to generate output data,
   wherein phases of the first clock signal, the second clock signal, the third clock signal and the fourth clock signal are different.

2. The clock data recovery circuit as claimed in claim 1, further comprising:
   a charge pump circuit, coupled to the phase detector, and generating and adjusting a voltage value of a pumping voltage according to the phase state signal; and
   an oscillator, coupled to the charge pump circuit, and adjusting a frequency of the first clock signal according to the pumping voltage.

3. The clock data recovery circuit as claimed in claim 1, wherein the phase blender delays the first clock signal to generate the third clock signal, and delays the second clock signal to generate the fourth clock signal.

4. The clock data recovery circuit as claimed in claim 3, wherein the first clock signal and the third clock signal have a preset phase difference, the third clock signal and the second clock signal have the preset phase difference, and the second clock signal and the fourth clock signal have the preset phase difference.

5. The clock data recovery circuit as claimed in claim 1, wherein the data sampling position detector comprises:
   a first dual-edge triggered flip-flop, sampling the data signal according to a rising edge and a falling edge of the third clock signal, so as to generate the third sampled data;
   a second dual-edge triggered flip-flop, sampling the data signal according to a rising edge and a falling edge of the fourth clock signal, so as to generate metadata;
   a third dual-edge triggered flip-flop, sampling the metadata according to the rising edge and the falling edge of the third clock signal, so as to generate the fourth sampled data; and
   a comparator, comparing the third sampled data with the fourth sampled data to generate the control signal.

6. The clock data recovery circuit as claimed in claim 5, wherein the comparator is an XOR gate.

7. The clock data recovery circuit as claimed in claim 1, wherein the phase detector comprises:
   a first dual-edge triggered flip-flop, sampling the data signal according to a rising edge and a falling edge of the first clock signal, so as to generate the first sampled data;
   a second dual-edge triggered flip-flop, sampling the first sampled data according to a rising edge and a falling edge of the second clock signal, so as to generate fifth sampled data;
   a third dual-edge triggered flip-flop, sampling the data signal according to the rising edge and the falling edge of the second clock signal, so as to generate the second sampled data;
   a fourth dual-edge triggered flip-flop, sampling the second sampled data according to the rising edge and the falling edge of the first clock signal, so as to generate sixth sampled data;
   a comparison circuit, comparing the second sampled data with the fifth sampled data and comparing the first sampled data with the sixth sampled data to respectively generate a first phase state sub-signal and a second phase state sub-signal; and
   a fifth dual-edge triggered flip-flop, sampling the first phase state sub-signal according to a rising edge and a falling edge of the third clock signal to generate the phase state signal.

8. The clock data recovery circuit as claimed in claim 1, wherein the data selector comprises:
   a selection signal generator, generating a first selection signal, a second selection signal and a third selection signal according to the control signal, a first phase state sub-signal and a second phase state sub-signal;
   a leading data generator, selecting one of the fourth sampled data and the first sampled data according to the first selection signal to generate first selected data;
   a lagging data generator, selecting one of the third sampled data and the second sampled data according to the second selection signal to generate second selected data; and
   a selector, selecting one of the first selected data and the second selected data according to the third selection signal to generate the output data.

9. The clock data recovery circuit as claimed in claim 8, wherein the selection signal generator is a state machine circuit, and the selection signal generator is configured to:
   enter a second sub-state of a leading state from a first sub-state of the leading state when the control signal is at a first logic level and the first phase state sub-signal is at a second logic level;
   enter a first sub-state of a lagging state from the first sub-state of the leading state when the control signal and the second phase state sub-signal are both at the second logic level;
   enter the first sub-state of the leading state from the second sub-state of the leading state when the control signal and the first phase state sub-signal are both at the second logic level;
   enter the second sub-state of the leading state from the first sub-state of the lagging state when the control signal and the first phase state sub-signal are both at the second logic level;
   enter a second sub-state of the lagging state from the first sub-state of the lagging state when the control signal is at the first logic level and the second phase state sub-signal is at the second logic level; and
   enter the first sub-state of the lagging state from the second sub-state of the lagging state when the control signal and the second phase state sub-signal are both at the second logic level.

10. The clock data recovery circuit as claimed in claim 9, wherein the selection signal generator is further configured to:
   generate the second selection signal of the second logic level in the first sub-state of the leading state;
   generate the second selection signal of the first logic level in the second sub-state of the leading state;
   generate the first selection signal of the second logic level in the first sub-state of the lagging state;
   generate the first selection signal of the first logic level in the second sub-state of the lagging state;
   generate the third selection signal of the second logic level in the leading state; and
   generate the third selection signal of the first logic level in the lagging state.

* * * * *